(12) United States Patent
Seibel (10) Patent No.: US 8,772,798 B2
(45) Date of Patent: Jul. 8, 2014

(54) LED BASED LIGHTING SYSTEM

(75) Inventor: Harry Seibel, Durham, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 13/602,950

(22) Filed: Sep. 4, 2012

(65) Prior Publication Data

US 2014/0061689 A1    Mar. 6, 2014

(51) Int. Cl.
*H01L 29/20*    (2006.01)

(52) U.S. Cl.
USPC .......................................... 257/89

(58) Field of Classification Search
CPC ....... H01L 33/44; H01L 33/50; H01L 33/502; H01L 33/504
USPC .................... 257/89, 91, 95, 98, 99
See application file for complete search history.

(56) References Cited

U.S. PATENT DOCUMENTS

2006/0245188 A1*  11/2006  Takenaka ................... 362/231
2010/0252851 A1   10/2010  Emerson et al.
2011/0220929 A1*  9/2011   Collins et al. ................ 257/98
2011/0273079 A1*  11/2011  Pickard et al. ............... 313/483
2012/0292651 A1*  11/2012  You et al. .................... 257/98

OTHER PUBLICATIONS

Williams, Jody, Soldermask:It's not just green anymore, Mar. 2005, Printed Circuit Design & Manufacture, pp. 52-54.*
U.S. Appl. No. 13/312,518, filed Dec. 6, 2011.
U.S. Appl. No. 13/463,267, filed May 3, 2012.
Ohno, Yoshi, Color Rendering and Luminous Efficacy of White LED Spectra, National Institute of Standards and Technology; Fourth International Conference on Solid State Lighting, 2004, Proc. of SPIE, vol. 5530, SPIE, Bellingham, WA.

* cited by examiner

*Primary Examiner* — Yu-Hsi D Sun
*Assistant Examiner* — Christina Sylvia
(74) *Attorney, Agent, or Firm* — Dennis J. Williamson; Moore and Van Allen PLLC (57) ABSTRACT

An LED device comprises an LED chip or LED chip array for emitting light of a color spectrum, the LED chip or array being mounted on a component having a component surface. At least one color is applied to the component surface where the color is selected to reflect light to color tune the light emitted from the LED device to obtain a desired CRI.

25 Claims, 8 Drawing Sheets

LED BASED LIGHTING SYSTEM

BACKGROUND

Light emitting diode (LED) lighting systems are becoming prevalent as replacements for older lighting systems and are used in many other applications. LED systems are an example of solid state lighting (SSL) and have advantages over traditional lighting solutions, such as incandescent and fluorescent lighting, because they use less energy, are more durable, operate longer, and generally contain no lead or mercury. A solid-state lighting system may take the form of a lighting unit, light fixture, light bulb, or a lamp. An LED lighting system may include, for example, a packaged light emitting device including one or more light emitting diodes (LEDs), which may include inorganic LEDs, which may include semiconductor layers forming p-n junctions and/or organic LEDs, which may include organic light emission layers.

LEDs may generate light in a wide variety of colors and can be combined in multi-color arrays that can be controlled to deliver virtually any color light including light perceived as white or near-white. Output color of such a device may be altered by separately adjusting the supply of current to different color LEDs.

SUMMARY

In one embodiment, an LED for emitting light comprising at least one constituent of a color spectrum. The LED chip is mounted on a component having a component surface. A colorant of a first color is applied to the component surface where the colorant is in the color spectrum of the at least one color constituent.

In another embodiment an LED device comprises a plurality of LED chips each of the LED chips emitting light of a color spectrum. The plurality of LED chips are mounted on a component having a component surface. A colorant is applied to the component surface where the colorant is in the color spectrum of at least one of the plurality of LED chips.

In another embodiment an LED device comprises an LED chip for emitting light of a color spectrum, the LED chip being mounted on a component having a component surface. A colorant is applied to the exposed surface where the colorant is selected to reflect light to color tune the light emitted from the LED device to obtain a desired CRI.

In still another embodiment, an LED device comprises an LED chip for emitting light of a color spectrum. The LED chip is mounted on a component having a component surface. A colorant is applied to the component surface where the colorant is in a second color spectrum.

The LED device may comprise a lens that receives the light. The component surface may reflect a portion of the light emitted from the LED chip. The colorant may be in a solder mask applied to the component. The colorant may be applied to the entire component surface. The colorant may be applied to a portion of the exposed component surface. The colorant may be applied to a first component surface and a second color is applied to a second component surface. The colorant may be applied to a first area of the component surface and a second color may be applied to a second area of the component surface. The colorant may be in the color spectrum of the light emitted from a first one of the plurality of LED chips and the second color may be in the spectrum of the light emitted from a second one of the plurality of LED chips, where the color of the light emitted from the first one of the plurality of LED chips is different than the color of the light emitted from the second one of the plurality of LED chips.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

The terms "LED" and "LED device" as used herein may refer to any solid-state light emitter. The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. A solid-state light emitter produces light (ultraviolet, visible, or infrared) by exciting electrons across the band gap between a conduction band and a valence band of a semiconductor active (light-emitting) layer, with the electron transition generating light at a wavelength that depends on the band gap. Thus, the color (wavelength) of the light emitted by a solid-state emitter depends on the materials of the active layers thereof. In various embodiments, solid-state light emitters may have peak wavelengths in the visible range and/or be used in combination with lumiphoric materials having peak wavelengths in the visible range. Multiple solid state light emitters and/or multiple lumiphoric materials (i.e., in combination with at least one solid state light emitter) may be used in a single device to produce light of virtually any color including white or near white. LEDs and/or LED packages used with embodiments of the invention can include light emitting diode chips that emit hues of light that, when mixed, are perceived in combination as various colors of light including white light.

Solid state light emitters may be used individually or in combination with one or more lumiphoric materials (e.g., phosphors, scintillators, lumiphoric inks) and/or optical elements to generate light at a peak wavelength, or of at least one desired perceived color (including combinations of colors). Inclusion of lumiphoric (also called 'luminescent') materials in lighting devices as described herein may be accomplished by direct coating on solid state light emitter, adding such materials to encapsulants, adding such materials to lenses, by embedding or dispersing such materials within lumiphor support elements, and/or coating such materials on lumiphor support elements. Other materials, such as light scattering elements (e.g., particles) and/or index matching materials, may be associated with a lumiphor, a lumiphor binding medium, or a lumiphor support element that may be spatially segregated from a solid state emitter.

An LED assembly may be provided with one or more light emitting LEDs and/or LED packages. Multiple LEDs may be used together, forming an LED array. The LEDs can be mounted on or fixed to a substrate in various ways. The LEDs may comprise an LED die disposed in an encapsulant such as silicone, and LEDs which may be encapsulated with a phosphor to provide local wavelength conversion. A wide variety of LEDs and combinations of LEDs may be used in the LED assemblies as described herein. Wires or other electrical conductors may be connected to an external AC power source to carry both sides of the supply to provide critical current to the LEDs. Power supply and/or driver(s) may form all or a portion of the electrical path between the power source and the LEDs. Some embodiments of the invention can include multiple LED sets coupled in series. The power supply in some embodiments can include a plurality of current diversion circuits, respective ones of which are coupled to respective nodes of the LED sets and configured to operate responsive to bias state transitions of respective ones of the LED sets. In some embodiments, a first one of the current diversion circuits is configured to conduct current via a first one of the LED sets and is configured to be turned off responsive to current through a second one of the LED sets. The first one of the current diversion circuits may be configured to conduct current responsive to a forward biasing of the first one of the LED sets and the second one of the current diversion circuit may be configured to conduct current responsive to a forward biasing of the second one of the LED sets. With respect to the features of the LED assembly and related electronics described above, the features can be combined in various ways. For example, various types of LED arrangements such as bare die versus encapsulated or packaged LED devices may be used. The embodiments shown and described herein are examples only and are intended to be illustrative of various designs for a LED or a LED lighting system.

The LEDs or LED chips can have many different semiconductor layers arranged in different ways and can emit many different colors in different embodiments according to the present invention. LED structures, features, and their fabrication and operation are generally known in the art and only briefly discussed herein. The layers of the LED chips can be fabricated using known processes with a suitable process being fabrication using metal organic chemical vapor deposition (MOCVD). The layers of the LED chips generally comprise an active layer/region sandwiched between first and second oppositely doped epitaxial layers all of which are formed successively on a growth substrate. LED chips can be formed on a wafer and then singulated for mounting in a package. It is understood that the growth substrate can remain as part of the final singulated LED or the growth substrate can be fully or partially removed. It is also understood that additional layers and elements can also be included in the LED chips including but not limited to buffer, nucleation, contact and current spreading layers as well as light extraction layers and elements. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In one embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP). The growth substrate can be made of many materials such at sapphire, silicon carbide, aluminum nitride (AlN), gallium nitride (GaN).

LEDs may be combined to produce light of different colors by mixing different color LEDs or by using LEDs that produce light of a specific desired color. While LEDs may produce light in a wide variety of colors it may be desirable to color tune the light emitted by the LEDs. Moreover, in a typical LED lighting system at least some of the light may be directed in a direction where a portion of the light is absorbed and/or reflected by components surrounding the LED. The absorption of the light may reduce the brightness of the LED while the reflection of the light may introduce unwanted color from the surrounding components into the emitted visible light.

In the LED lighting system of the invention exposed components or component surfaces of the LED may be colored with a colored pigment or colorant such that any light that is reflected from the exposed colored components or surfaces is used to color tune the light emitted from the LED. The color may be added as a pigment or colorant applied, such as in a coating, to the exposed surfaces of the components. For example, the color may be applied as a paint or lacquer. Alternatively, the color may be added to a component such as being incorporated into a solder mask or overcoat such that the solder mask or overcoat has the desired color. As used herein the term "component surface" means any component, portion of a component, or surface in an LED, LED package or LED array that may reflect or absorb light generated by the LED. In some embodiments the color is selected to match the color of the light emitted by the LED. For example, for an LED that emits red light a red pigment may be applied to or incorporated in the component surfaces of the LED. In other embodiments the color applied to the component surfaces may be selected to color tune the light emitted by the LED to obtain a desired color rendering index (CRI) of the emitted light but not necessarily to match the desired color. For example, the component surfaces of an LED that emits white light may be provided with a red pigment to color tune the emitted light. Example embodiments of the invention will be described to further explain the invention.

Figure 1:
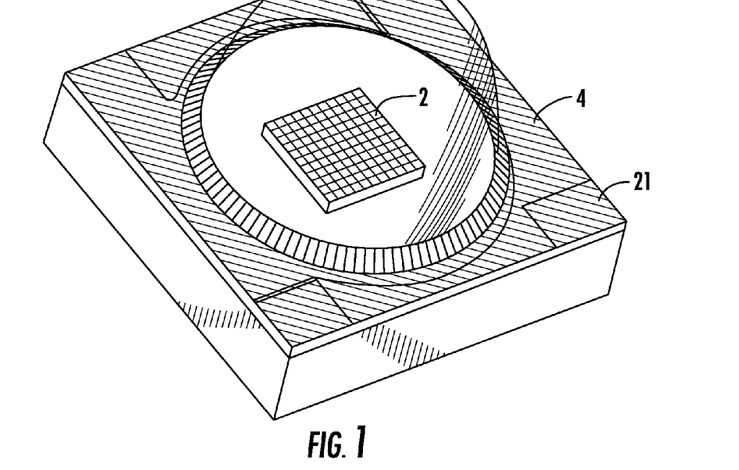
FIG. 1 is a perspective view of an embodiment of a packaged LED according to embodiments of the invention.
Figure 2:
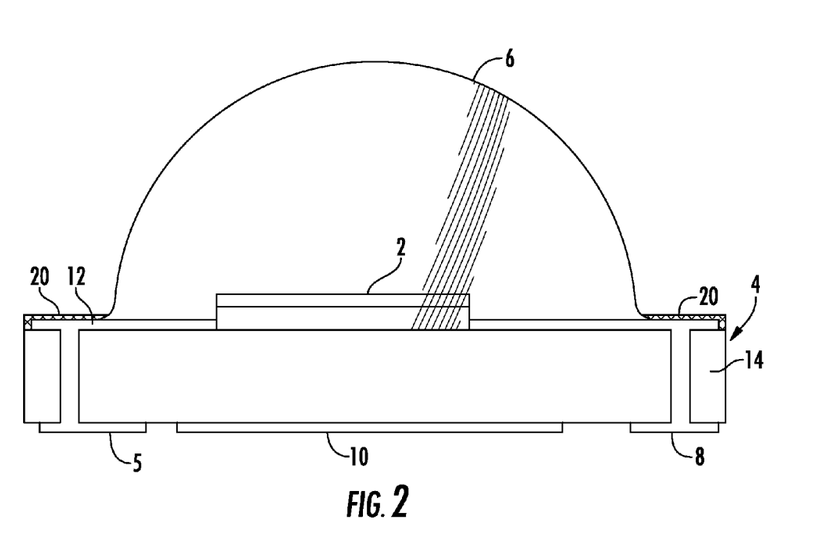
FIG. 2 is a side view of an embodiment of a packaged LED device according to embodiments of the invention.

Referring to FIGS. 1 and 2 an embodiment of an LED or LED package is illustrated comprising an LED chip 2 mounted on a substrate 4 and surrounded by a lens 6. The LED chip 2 may comprise a wide variety of configurations and materials as previously explained. The substrate 4 may have a wide variety of configurations, shapes and sizes. In one example embodiment the substrate may comprise a PCB. The LED may comprise a first layer comprising an anode 5 and a cathode 8 formed of, for example, copper and a thermal pad 10. The first layer may be separated from a second layer 12 formed of, for example, copper by a layer of dielectric material 14. The layers may be covered by a surface coating or plating such as a solder mask 20, electroless nickel immersion gold (ENIG), overcoat or the like. The solder mask may comprise SnAgCu solder. In another embodiment the substrate may comprise a metal-core printed circuit board MCPCB where the LED may comprise a first layer comprising an anode and a cathode formed of, for example, copper and a thermal pad. A dielectric layer may separate the top layer from an aluminum substrate. The first layer may be covered by a solder mask, for example, SnAgCu solder. Submounts of aluminum, copper or silicon may also be used. Many changes in the construction and arrangement of the substrate may be made from those described and shown herein.

Light emitted by the LED chip 2 is primarily directed out of the LED assembly through lens 6 as usable light. However, some of the light may be reflected from the component surfaces surrounding the LED chip 2. In one embodiment, the component surfaces are colored such that the light reflected from the component surfaces may be used to color tune the light emitted from the LED assembly. The color may be applied as a coating 21 (as shown in hatching on substrate 4 in FIG. 1) to the component surfaces or the color may be incorporated into a component such as by incorporating a colorant into solder mask 20 or other overcoat (as shown in cross-hatching in FIG. 2).

Figure 3:
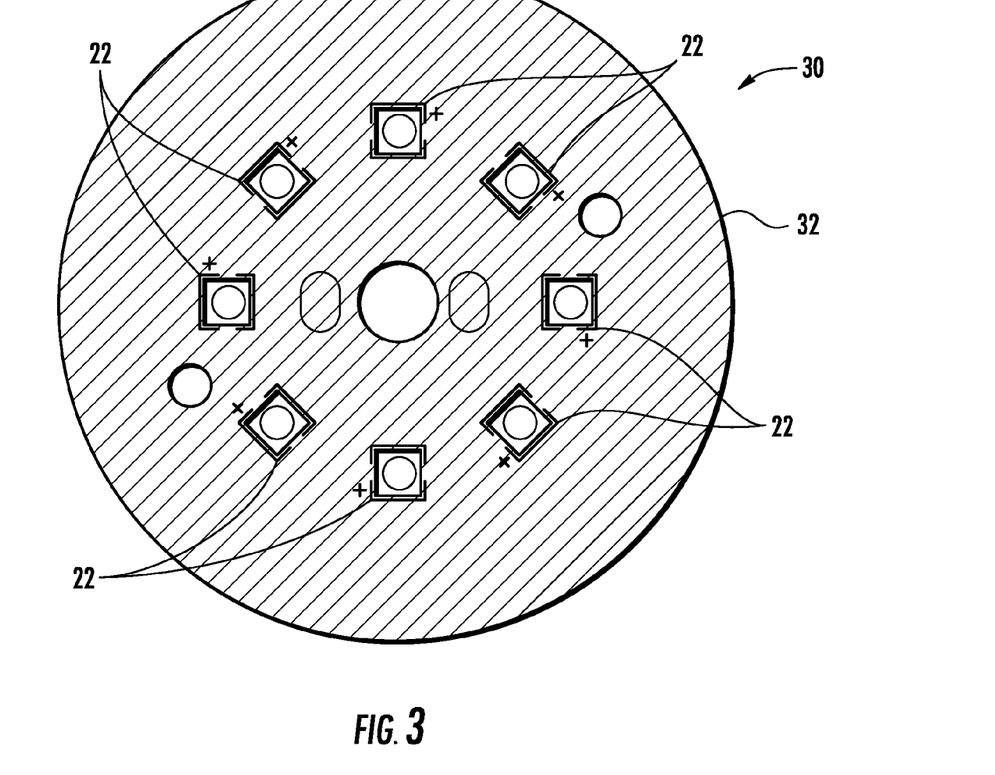
FIG. 3 is a top view of an embodiment of an array of LEDs.

In some embodiments an LED or LED package 22 may be arranged in an LED array 30 comprised of a plurality of LEDs or LED packages 22 as shown in FIG. 3. In such an array a plurality of LEDs or LED packages 22 may be mounted on a substrate or board 32 such as a MCPCB, lead frame or other suitable support. The LEDs may be reflow soldered to the board using a solder paste. The LEDs 22 in the array may comprise LEDs that emit the same or different color light and may be arranged in a wide variety of numbers and patterns. In this embodiment the component surfaces comprise the surfaces of the substrate 32 in addition to the components of the individual LEDs and/or LED packages 22. Color (as represented by hatching in FIG. 3) may be applied to the surface of the substrate 32, as previously described, to color tune the light emitted by the LED array.

Figure 4:
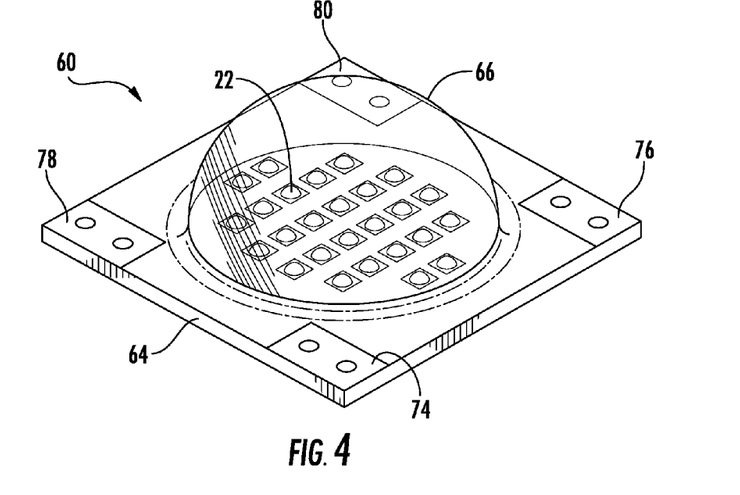
FIG. 4 is a perspective view of an embodiment of a packaged array of LEDs.
Figure 5:
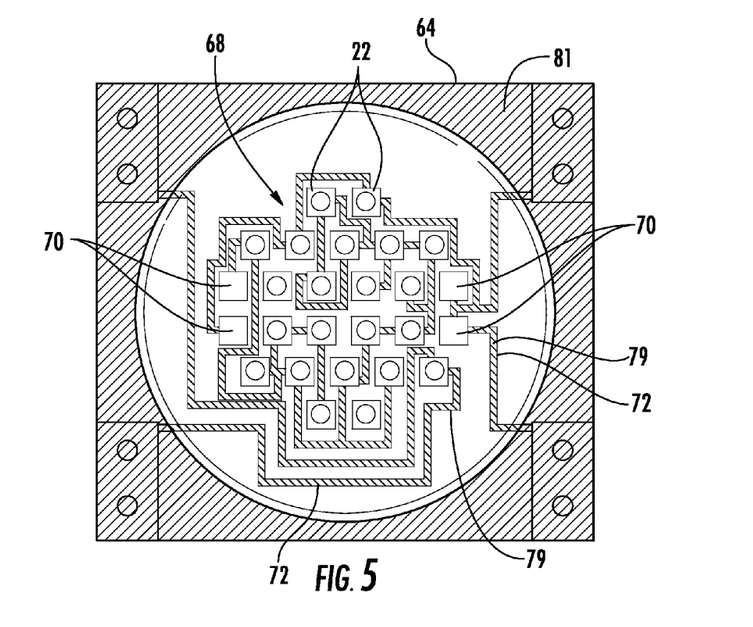
FIG. 5 is a top view of the embodiment of FIG. 4.

FIGS. 4 and 5 show another embodiment of a LED package 60 according to the present invention comprising an array of LED chips 22 mounted on the surface of a substrate 64. It is understood that different embodiments according to the present invention can have interconnect circuits of the various chip types arranged in many different ways, and can comprise series, parallel and/or series/parallel combination interconnect circuits. The LED chips 22 may be mounted on a substantially planar surface of the substrate 64 and may be arranged under a single optical lens element 66. In this and other embodiments, the LED package 60 emits light at a desired color point and color rendering index as combination of light from the various LEDs, and simultaneously emits the desired luminous flux at high efficacy.

The substrate 64 can be formed of many different materials with a preferred material being electrically insulating, such as a dielectric element, with the substrate being between the LED array and the component backside. The substrate can comprise a ceramic such as alumina, aluminum nitride, silicon carbide, or a polymeric material such as polymide and polyester etc. In one embodiment, the dielectric material has a high thermal conductivity such as with aluminum nitride and silicon carbide. In other embodiments the substrate 64 can comprise a printed circuit board (PCB), alumina, sapphire or silicon or any other suitable material. For PCB embodiments different PCB types can be used such as standard FR-4 PCB, metal core PCB, or any other type of printed circuit board. The size of the substrate 64 in LED package 60 can vary depending on certain factors such as the size and number of LEDs.

The top surface of the substrate 64 is shown in FIG. 5 as having planar surface with patterned conductive features 68 that can include die attach pads 70 and interconnecting conductive traces 72. These features 68 provide conductive paths for electrical connection to the LED chips 22 using known contacting methods. Each of the LED chips 62 can be mounted to a respective one of the attach pads 70 using known methods and material such as using conventional solder materials that may or may not contain a flux material. The LED chips 22 can similarly be mounted and electrically connected to the conductive traces 72 using known surface mount or wire bonding methods depending on the geometry of the LED chips 22. Alternatively, flip chip LEDs can be mounted on the attach pads and conductive traces. The attach pads 70 and interconnecting traces 72 can comprise many different materials, such as metals or other conductive materials, and in one embodiment they can comprise copper deposited using known techniques such as plating. In other embodiments according to the present invention some or all of the features 68 can comprise other additional materials beyond copper. For example, the die attach pads can be plated or coated with additional metals or materials to the make them more suitable for mounting one of the LED chips 22.

Electrical signals can be applied to the LED component 60 by providing external electrical contact to bond pads 74, 76, 78 and 80, such as by wire or ribbon bonding or other connection methods such as the soldering of leads, special connectors or mounting the LED component to conductive paths on for example, a PCB. In the embodiment shown the LED component 60 is arranged for mounting using surface mount technology.

A solder mask can also be included on the submount's top or bottom surface at least partially covering the conductive traces 72, portions of the other conductive features, and/or portions of the substrate surface. The bond pads and die attach pads are typically left uncovered, with the solder mask protecting the conductive traces 72 and other covered features during subsequent processing steps.

In some embodiments the LEDs are arranged in an array on the submount surface in a substantially symmetrical two dimensional layout although the layout need not be symmetrical and may comprise three-dimensional arrays. The LED array may have groups of LEDs emitting different colors of light, where different colors can be intermixed in the array to achieve the desired color mixing. Many different numbers of LED chips can be included in the array arranged in a variety of different layouts. At least some of the LEDs may be electrically connected in series to provide for at least one serial circuit, with the LED array component capable of emitting multiple colors of light, including white light. In some embodiments having arrays with groups of LEDs emitting different colors of light, the LEDs of each color may be electrically connected in series. In one embodiment the component surfaces are colored (as shown by hatching in FIG. 5) such that the light reflected from the component surfaces may be used to color tune the light emitted from the LED assembly. The component surfaces may comprise, but are not limited to, the substrate, conductive traces, solder mask, bond pads and the like in addition to the component surfaces of the individual LEDs or LED packages 22. The color may be applied as a coating or paint 81 over the top of the components surfaces or incorporated into components such as being incorporated into a solder mask 79 (as shown by the shaded area in traces 72).

Figure 6:
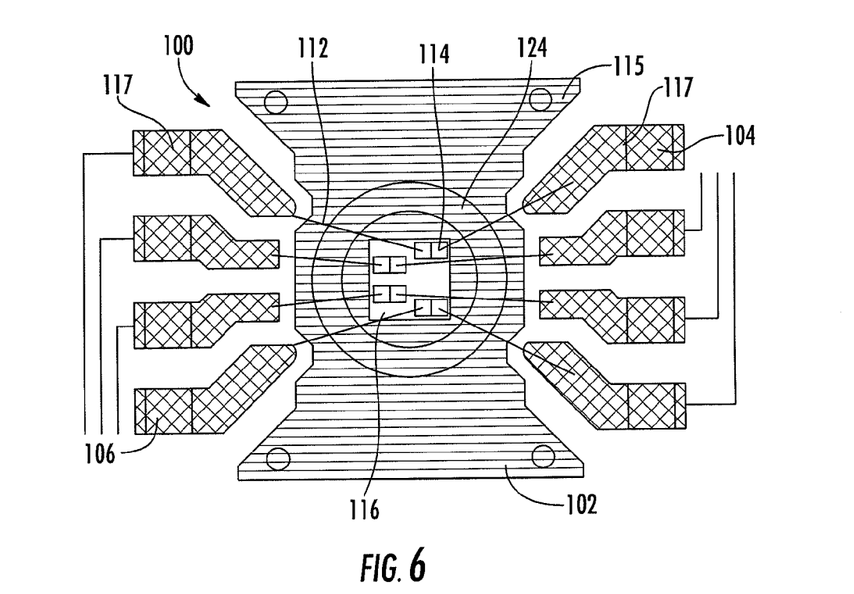
FIG. 6 is a top view of another embodiment of an array of LEDs.

Referring to FIG. 6, another embodiment of an LED is shown comprising a leadframe 100 including a central region 102 and a plurality of leads 104, 106 extending away from the central region 102. The electrical leads 104, 106 may be electrically isolated from one another and/or from the central region 102 of the leadframe 100. The leads may be arranged such that leads of opposite polarity type (e.g. anodes or cathodes) are provided on opposite sides of the leadframe 100, which may facilitate the connection of packages using the leadframes 100 in series.

A substrate 116 including a plurality of solid state light emitting devices 114 is mounted within a reflector 124. The substrate 116 may include a nonconductive material such as aluminum nitride, silicon carbide and/or chemical vapor deposited (CVD) diamond on which a plurality of electrical traces (not shown) may be formed. A plurality of wirebond connections 112 may be made between the substrate 116 and the devices 114 on one hand and respective ones of the electrical leads 104, 106 on the other hand. In one embodiment the component surfaces are colored such that the light reflected from the component surfaces may be used to color tune the light emitted from the LED assembly. The component surfaces may comprise the lead frame including the reflector 124, leads 104 and 106, wirebond connections 112, and/or substrate 116 and/or solder masks or other overcoats applied to the leadframe 100. Color 115 may be applied to the component surfaces as shown by hatching in FIG. 6. Moreover, a second color 117 is shown applied to some component surfaces (as shown by cross-hatching). The colors may be applied as a coating or paint over the top of the components surfaces or incorporated into components such as being incorporated into a solder mask or overcoat as previously described. While multiple colors are shown a single color may be used if desired.

Figure 7:
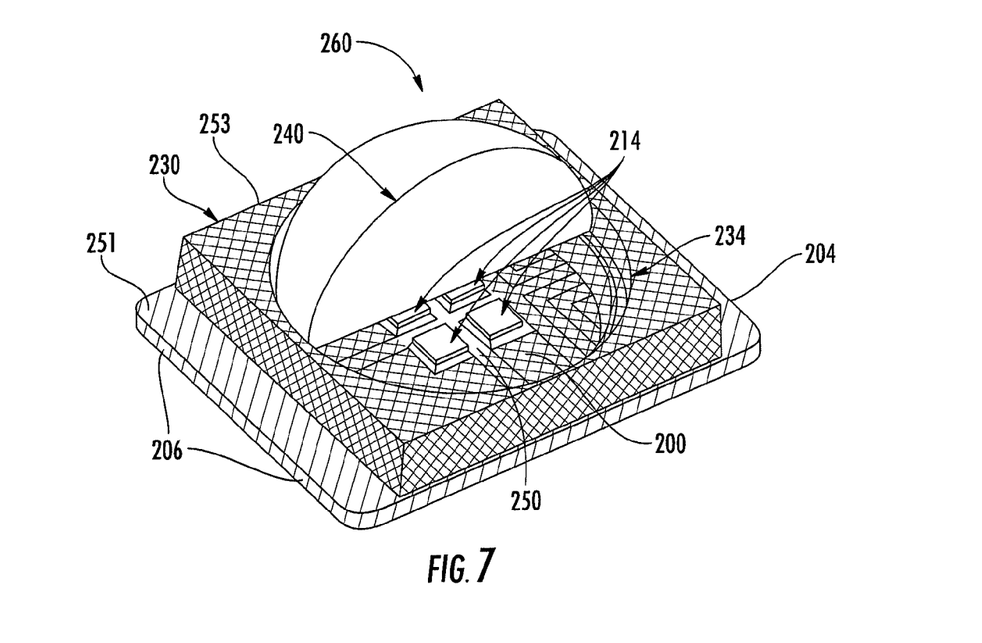
FIG. 7 is a partially cut-away perspective view of an embodiment of a packaged array of LEDs.

FIG. 7 is a perspective cutaway view of a package 260 according to embodiments of the invention showing a package body 230 molded onto a leadframe 200. Four solid state light emitting devices 214 are mounted on the leadframe 200 within the optical cavity 250 defined by the sidewalls 234 of the package body 230. The solid state light emitting devices may be electrically connected to respective ones of the first electrical leads 206 and the second electrical leads 204, which extend from opposite sides of the package. A lens 240 is positioned above the optical cavity 250. In one embodiment the component surfaces are colored 251 (as represented by the hatching in FIG. 7) such that the light reflected from the component surfaces may be used to color tune the light emitted from the LED assembly. Moreover, a second color 253 is shown applied to some component surfaces (as shown by cross-hatching). The component surfaces may comprise, but are not limited to, the lead frame 100 and, package body 230. While multiple colors are shown a single color may be used if desired.

Figure 8:
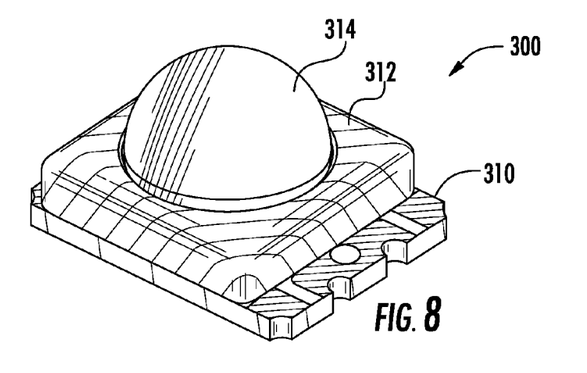
FIG. 8 is a perspective view of another embodiment of a packaged array of LEDs
Figure 9:
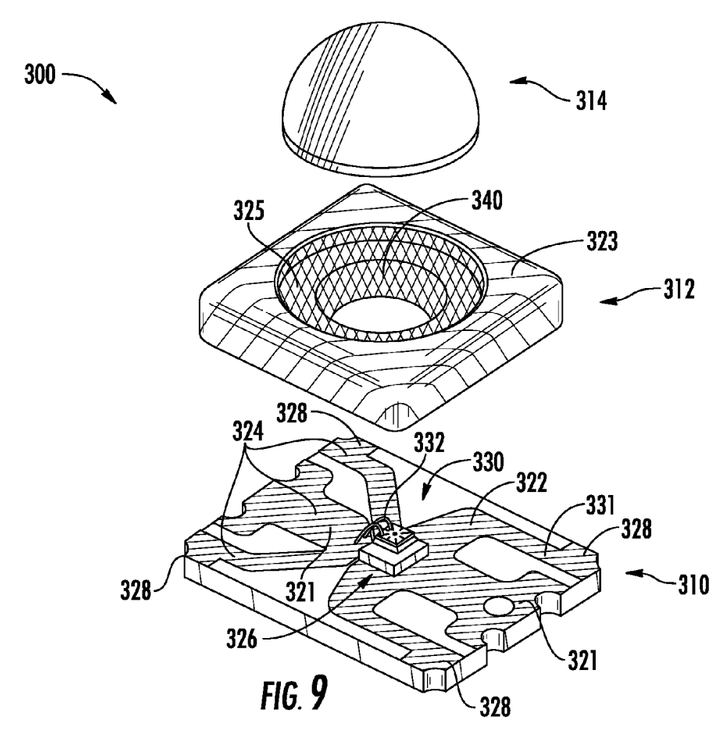
FIG. 9 is an exploded view of the packaged array of LEDs of FIG. 8.

Referring to FIGS. 8 and 9, the light emitting die package 300 of the present invention includes a substrate 310, a top body 312, and a lens 314. The substrate 310 provides support for electrical traces 322 and 324; for solder pads; and for the LED assembly 326. The traces 322 and 324 and the solder pads can be fabricated using conductive material. Further, additional traces and connections can be fabricated on the top, side, or bottom of the substrate 310, or layered within the substrate 310. The traces 322 and 324, the solder pads, and any other connections can be interconnected to each other in any combination using known methods, for example via holes. The substrate 310 may be made of material having high thermal conductivity but is electrically insulating, for example, aluminum nitride or alumina.

The substrate 310 has a top surface 330, the top surface 330 may include the electrical traces 322 and 324. The traces 322 and 324 provide electrical connections from the solder pads 328 to LED assembly 326. The traces 322 and 324 provide electrical routes to allow the LED assembly 326 to electrically connect to the solder pads. Accordingly, some of the traces are referred to as first traces 322, while other traces are referred to as second traces 324. In the illustrated example, the LED assembly 326 is placed on the first trace 322 portion of the mounting pad thereby making contact with the first trace 322. In the illustrated embodiment, a top of the LED assembly 326 and the second traces 324 are connected to each other via a bond wire 332. Depending on the construction and orientation of LED assembly 326, first traces 322 may provide anode (positive) connections and second traces 324 may comprise cathode (negative) connections for the LED assembly 326 (or vice versa). The LED assembly 326 can include additional elements. Such an LED package is known in the art and is illustrated for the purposes of discussing the invention and is not meant to be a limitation of the present invention. In the Figures, the LED assembly 326 is shown die-attached to the substrate. In alternative embodiments, the mounting pad can be configured to allow flip-chip attachment of the LED assembly 326. Additionally, multiple LED assemblies can be mounted on the mounting pad. In alternative embodiments, the LED assembly 326 can be mounted over multiple traces. This is especially true if flip-chip technology is used. The topology of the traces 322 and 324 can vary widely from the topology illustrated in the Figures while still remaining within the scope of the example embodiments of the present invention.

A high temperature, mechanically tough, dielectric overcoat material can be used to overcoat the traces 322 and 324 (with the exception of the central die-attach area) to seal the traces 322 and 324 and provide protection from physical and environmental harm such as scratches and oxidation. One such dielectric material may be a solder mask. Overcoating process can be a part of the substrate manufacturing process. The overcoat, when used, may insulate the substrate 310 from the body 312. The overcoat may then be covered with a high temperature adhesive such as thermal interface material that bonds the substrate 310 to the top body 312.

The body 312 may include a surface 340 substantially surrounding the LED assembly 326. When the body 312 is used to dissipate heat generated by the LED in the die package, it can be "top-mounted" directly onto an external heat sink by an adhesive or solder joint to dissipate heat efficiently. In another embodiment, if heat has to be dissipated by either a compressible or non-compressible medium such as air or cooling fluid, the body 312 may be equipped with cooling fins or any feature that will enhance heat transfer between the body and the cooling medium. The surface 340 reflects portions of light from the LED assembly 326. Other portions of the light are not reflected. The body 312 may support the lens 314. The LED assembly may be encapsulated within the die package using encapsulation material such as, for example only, soft and elastic silicones or polymers. In one embodiment the component surfaces are colored such that the light reflected from the component surfaces may be used to color tune the light emitted from the LED assembly.

When the LED is turned on light is generated that primarily directed out of the LED as usable light. However, a portion of the light may be directed toward the exposed component surfaces and be absorbed and/or reflected into the light emitted from the LED. In the LED system of the invention the component surfaces are coated or otherwise colored with a color pigment or colorant to color tune the light emitted from the LED. Coloring the component surfaces such that the light reflects from the component surfaces also may increase the luminosity of the LED. The color may be applied in the overcoat and/or solder mask 321 on traces 322, 324 (as shown in hatching in FIG. 9). Color may also be applied as a coating 323 (*as* shown in hatching in FIG. 9) and coating 325 (as shown as cross-hatching in FIG. 9) on other component surfaces. Different colors may be used on various component surfaces 321, 323 and/or 325 or the same color may be used on all of the component surfaces.

Figure 15:
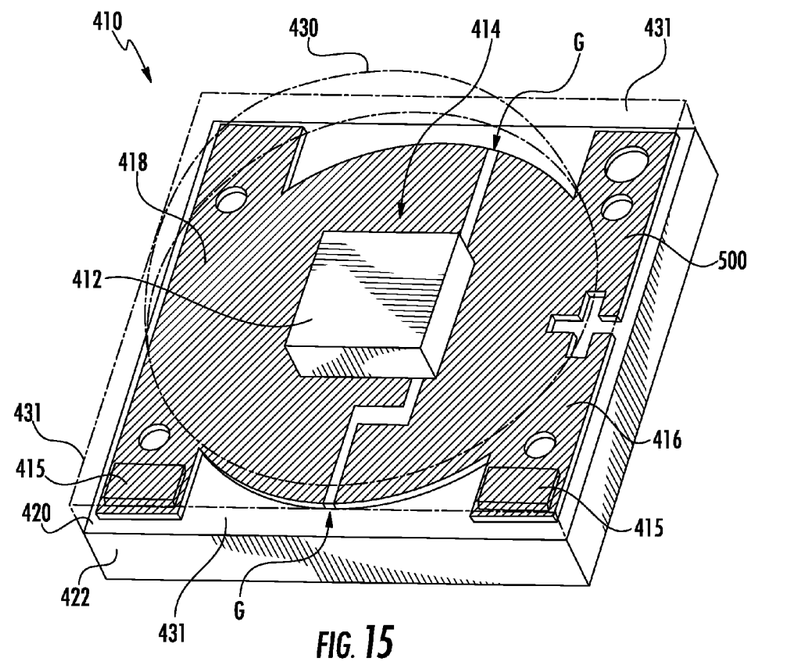
FIG. 15 is a perspective view of another embodiment of a packaged LED according to embodiments of the invention.

Referring to FIG. 15 another embodiment of an LED device is shown. LED 410 can comprise at least one light emitter such as a solid state emitter or LED chip 412 that can be disposed or arranged over a chip or die attach area referred to herein as a mounting area, generally designated 414. Mounting area 414 can comprise patterned conductive features for passing electrical current into LED chip 412 as well as providing an area for laterally spreading heat. LED chip 412 as shown in FIG. 15 is for illustration purposes only as LED chip can be of any suitable shape or configuration. Mounting area 414 can comprise any suitable electrically conductive material known in the art, for example, metals or metal alloys, copper (Cu), aluminum (Al), tin (Sn), silver (Ag), conductive polymer material(s), and/or combinations thereof. Mounting area 414 can be formed integrally with or electrically and/or thermally isolated from electrical components of light emitter device 410. For example, electrical components can comprise first and second electrical contact areas or elements 416 and 418, respectively. First and second electrical elements 416 and 418 can comprise, for example and without limitation, any suitable electrically conducting material known in the art, for example, metals or metal alloys, Cu, Al, Sn, Ag, conductive polymer material(s), and/or combinations thereof.

In one aspect, mounting area 414 and first and second electrical elements 416 and 418 can comprise copper (Cu) deposited using known techniques such as plating. Mounting area 414 and first and second electrical elements 416 and 418 can be disposed over and/or attached to a top surface 420 of a substrate or submount 422. In one aspect, mounting area 414 can be integrally formed with and as an extension of first and/or second electrical elements 416 or 418, respectively. First electrical element 416 and second electrical element 418 can be physically separated and electrically and/or thermally isolated from each other such as by gap G. For illustration purposes, only one LED chip 412 is shown, however, multiple LED chips 412 having similar or different wavelengths of light are also contemplated. Gap G can extend down to top surface 420 of submount 422 thereby electrically and thermally isolating electrical elements 416 and 418. In one aspect, gap G can provide electrical isolation between the first and second electrical elements 416 and 418 to prevent shorting of the electrical signal applied to LED chip 412.

To improve heat dissipation of LED 410, mounting area 414 and electrical elements 416 and 418 can provide laterally extending thermally conductive paths for conducting heat away from LED chip 412 such that it can spread to other areas of submount 422 beyond areas just below LED chip 412. For example, mounting area 414 can cover more surface area of top surface 420 of submount 422 than that covered by LED chip 412. Mounting area 414 can extend proximate or to the edges of submount 422. In the embodiment shown, mounting area 414 is generally circular and extends radially from LED chip 412 toward the edges of submount 422. It is understood that mounting area 414 can comprise any suitable shape and/or or size and that in some embodiments it can extend flush with the edge of submount 422.

In general, LED chip 412 as described herein can embody a solid state emitter used alone and/or in combination with one or more phosphors or lumiphors to emit light of various colors, color points, or wavelength ranges, such as, but not limited to, the following: (1) primarily blue wavelengths (preferably approximately 430 nm to 480 nm; optionally 430-475 nm, 440-475 nm, 450-475 nm, or any suitable sub-range of 430-480 nm); (2) primarily cyan wavelengths (preferably approximately 481 nm to 499 nm); (3) primarily green wavelengths (preferably approximately 500 nm to 570 nm, optionally 505-515 nm, 515-527 nm, or 527-535 nm, or 535-570 nm, or any suitable sub-range of 500-570 nm a or any suitable sub-range of 500-570 nm); (4) primarily yellow wavelengths (preferably approximately 571 to 590 nm); and (5) primarily red wavelengths (preferably approximately 591 to 750 nm, including an optional orange sub-range (preferably approximately 591 to 620 nm), or 621-750 nm, or 621-700 nm, or 600-700 nm, or 610-700 nm, or 610-680 nm, or 620-680 nm, or 620-670 nm, and/or any suitable sub-range of 591 to 750 nm).

In one aspect, LED 410 can comprise one LED chip 412 that can be primarily blue, which when illuminated can activate a yellow phosphor disposed over LED chip 412 (e.g., phosphor can be at least partially directly disposed over LED chip 412 and/or on a portion of device 410 that is disposed over LED chip 412, for example, such as on lens 430) such that the LED chip 412 comprises a blue shifted yellow (BSY) LED chip 412. In an alternative embodiment, a primarily red LED chip 412 can also be included and disposed below phosphor, encapsulant, and/or lens 430 for mixing to produce warm white output. LED 410 can also comprise an LED chip 412 configured to activate a red phosphor either disposed over LED chip 412 and/or over a portion of LED 410, as for example, red phosphor can be disposed on or in a portion of lens 430 for producing warm white output. In yet a further alternative embodiment, LED 410 can comprise more than one LED chip 412 such as a plurality of LED chips. The plurality of LED chips 412 can comprise approximately the same wavelength (e.g., selected from the same targeted wavelength) or at least a first LED chip of the plurality of LED chips 412 can comprise a different wavelength from a second LED chip of the plurality of LED chips 412 (e.g., at least a first LED could be selected from a different targeted wavelength than a second LED). As noted earlier, one or more LED chips 412 can be provided in LED 410 and can comprise one or more combinations of color points or wavelengths. For example, one or more LED chips 12 can emit primarily blue, green, red, yellow, cyan, amber wavelength(s), and any combinations thereof, including white light.

LED chip 412 can be mounted to mounting area 414 of device 410 using any suitable known method and material. LED chip 412 can comprise electrical contacts (e.g., an anode and a cathode) on one or more surfaces of chip 412. In one aspect, LED chip 412 can be vertically structured such that a first electrical contact is on a first surface and a second electrical contact is on a second surface of LED chip 412 which opposes the first surface. In this case a wire bond (not shown) can be used to electrically connect LED chip 412 to first and/or second elements 416 and 418, respectively. In other aspects, LED chip 412 can comprise a horizontally structured device having both electrical contacts (e.g., the anode and the cathode) on the same surface, for example, a bottom surface. In this aspect, wire bonds may not be necessary, as contacts may electrically connect to first and second electrical elements 416 and 418 via die attach methods/materials. LED chip 412 of FIG. 1 can comprise a horizontally structured device with both electrical contacts on the bottom surface. The bottom surface can electrically connect with each of first and second elements 416 and 418 via die attach materials, for example, solder, epoxy or flux materials. In this aspect, LED chip 412 can be at least partially disposed over gap G such that the anode and the cathode are electrically isolated.

LED 410 can further and optionally comprise top side electrical contacts 415. In one aspect, top side electrical contacts 415 can be disposed over and electrically communicate with first and second electrical elements 416 and 418. Top side electrical contacts 415 can extend through protective layer 431 such that an external component (not shown) can attach to contacts 415 via soldering or any other attachment method to electrically connect to LED 410. Top side electrical contacts 415 are optional and can comprise any suitable electrically conductive material known in the art, for example, a metal, metal-alloy, Cu, Ag, Sn, electrically conductive ceramic, and/or polymeric material. In other aspects, top side electrical contacts 415 can comprise a body which receives an external electrical component (not shown, e.g., an electrical wire) and crimps, clamps, or otherwise retains the electrical component.

Submount 422 can comprise any suitable material, and can be electrically and/or thermally conductive or non-conductive. In one aspect, submount 422 can comprise a ceramic material such as a low temperature co-fired ceramic (LTCC) material, a high temperature co-fired ceramic (HTCC) material, alumina, aluminum nitride, aluminum oxide, glass, and/or an Al panel material. In other aspects, submount 422 can comprise a plastic material such as polyimide, polyamide, polyphthalamide, liquid crystal polymer, or silicone. In other embodiments submount 422 can comprise a printed circuit board (PCB) and variations thereof, sapphire, silicon, or any other suitable material, such as T-Clad thermal clad insulated substrate material. For PCB embodiments and variations thereof, different PCB types can be used such as standard FR-4 PCB, metal core PCB (MCPCB), or any other type of PCB available. In various aspects, it may be desirable to select a submount 422 comprising a material which is a good electrical insulator with low thermal resistance or high thermal conductivity.

Still referring to FIG. 15, LED 410 can further comprise a lens 430. Lens 430 can be formed over top surface 420 of submount 422 and disposed over the at least one LED chip 412. Lens 430 can provide both environmental and/or mechanical protection of device 410. Lens 430 can be disposed at different locations with respect to top surface 420 of submount 422. Lens 430 can comprise a protective layer 431 which can extend flush with sides of device 410 to cover portions of device 410, such as corners of device. Lens 430 and protective layer 431 can comprise, for example without limitation, silicones, plastics, epoxies, glasses, or combinations thereof.

When the LED is turned on light is generated that primarily directed out of the LED as usable light. However, a portion of the light may be directed toward the exposed component surfaces and be absorbed and/or reflected into the light emitted from the LED. In the LED system of the invention the component surfaces are coated or otherwise colored with a color pigment or colorant to color tune the light emitted from the LED. Coloring the component surfaces such that the light reflects from the component surfaces also may increase the luminosity of the LED. The color may be applied in the overcoat and/or solder mask 500 on first and second electrical elements 416 and 418 (as shown in hatching in FIG. 15). Color may also be applied as a coating over these and/or other component surfaces. Color may also be included in the protective coating 431. Different colors may be used on various component surfaces or the same color may be used on all of the component surfaces.

Examples of suitable LED devices are disclosed in U.S. patent application Ser. No. 13/312,518 filed Dec. 6, 2011 and assigned to Cree, Inc. of Durham, N.C. the disclosure of which is incorporated by reference herein in its entirety; United States Patent Application Publication Number US 2010/0252851 published Oct. 7, 2010 and assigned to Cree, Inc. of Durham, N.C. the disclosure of which is incorporated herein by reference in its entirety; and U.S. patent application Ser. No. 13/463,267 filed May 3, 2012 and assigned to Cree, Inc. of Durham, N.C. the disclosure of which is incorporated herein by reference in its entirety.

In one embodiment inorganic pigments are used to color the components. A wide variety of inorganic pigments may be used in a variety of colors. For example, inorganic pigments may include, but are not intended to be limited to, purple, blue, green, yellow, orange, red, brown, black and white. The inorganic pigment may be incorporated in a binder to create a paint, lacquer or coating that is applied to the component surfaces. The paint or lacquer may comprise other materials in addition to the binder and pigment. Alternatively, the pigment may be added to the solder mask or other overcoat such that the solder or overcoat itself is colored.

The pigment may be applied to the component surfaces where the color of the pigment is selected to enhance or color tune the light emitted by the LED. In one embodiment, the color of the pigment may be selected to match the color of the light emitted by the LED or to match a color constituent of the emitted light. The color spectrum of visible light is set forth below:

| The Visible Light Spectrum | |
|---|---|
| Color | Wavelength (nm) |
| Red | 625-740 |
| Orange | 590-625 |
| Yellow | 565-590 |
| Green | 520-565 |
| Cyan | 500-520 |
| Blue | 435-500 |
| Violet | 380-435 |

Figure 10:
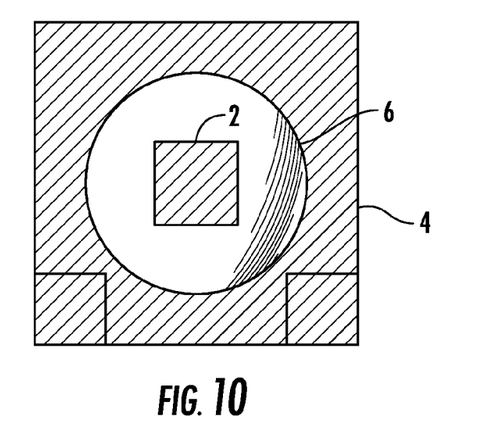
FIGS. 10, 11 and 12 are top views of embodiments of LEDs showing various color arrangements.

The term "match" is used herein to mean that the color used to color the component surfaces is in the same spectrum range as the color of the light emitted from the LED or in the same spectrum range as a color constituent of the emitted light.

Where the color of the component surfaces matches the light emitted from the LED, the color reflected from the component surfaces will "match" the color of the emitted light from the LED. Thus, for example, in a red LED the components are colored red, in a blue LED the components are colored blue, in a yellow LED the component surfaces are colored yellow and so on. While the color of the light emitted by the LED and the color of the components may be in the same spectrum, the actual shades or hues of the colors may be different such that the color of the components may be used to color tune the light emitted from the LED. For example, in one embodiment a blue LED may have a component surface color that, while in the blue spectrum, may be perceived as a darker or lighter blue than the light emitted by the LED. In such an arrangement the light emitted from the LED device may be tuned to produce a slightly different color light than the light actually generated by the LED chip. FIG. 10 shows an LED assembly where the component surfaces outside of the lens 6 are colored (as represented by cross hatching in the figures) to match the color of the visible light emitted by the LED.

Figure 11:
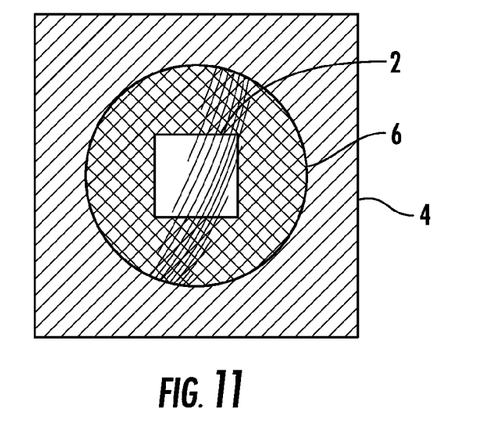
Figure 12:
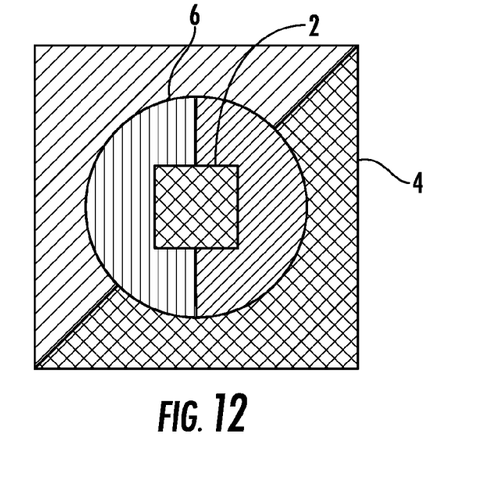

In some embodiments, the component surfaces may be treated with a color that does not match the color of the light emitted by the LED. FIG. 1 shows an LED device where the component surfaces (e.g. substrate 4) are colored a different color than the color of the visible light emitted by the LED 2. The color may be selected to color tune the emitted light by slightly altering the characteristics of the light. For example, in a blue LED a different color may be applied to the component surfaces to make the color emitted by the LED package a slightly different color than an uncolored LED package. Many other combinations of colorants and LED colored light are also possible and the examples provided herein are made by way of example only. FIG. 11 shows an LED assembly where both the component surfaces on the inside of and the outside of the lens 6 are colored. In one embodiment, the color of the component surfaces inside of the lens may match or not match the color of the light emitted by the LED chip 2. The light emitted from chip 2 and the light reflected from the component surfaces inside of lens 6 will combine to create light of a desired CRI. The color of the components outside of the lens 6 may match, or may not match, the color of the light emitted from the lens and may or may not match the color of the component surfaces inside of lens 6. FIG. 12 shows another embodiment, where multiple colors are used on the component surfaces such that the reflected light may have multiple color components that may be mixed with the light emitted from chip 2. In the illustrated embodiment four different colors are used; however, a greater or fewer number of colors may be used. Some of the colors may match the color of the light emitted by the LED chip 2.

Figure 13:
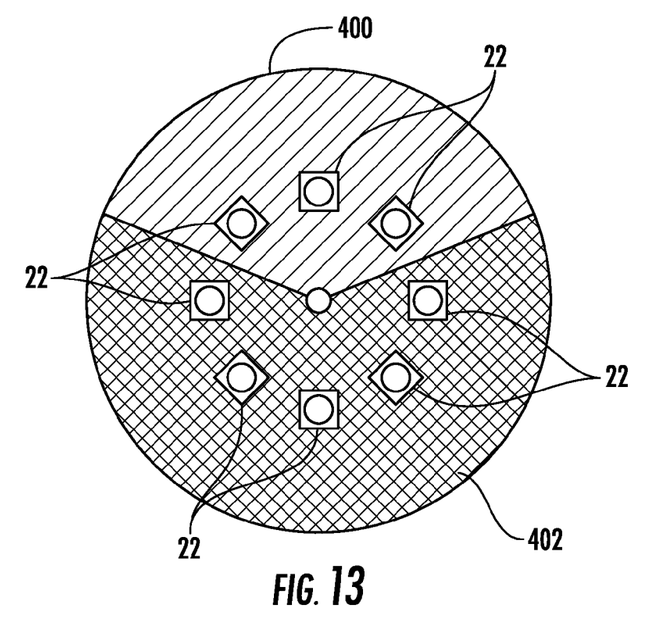
FIGS. 13 and 14 are top views of embodiments of an array of LEDs showing various color arrangements.
Figure 14:
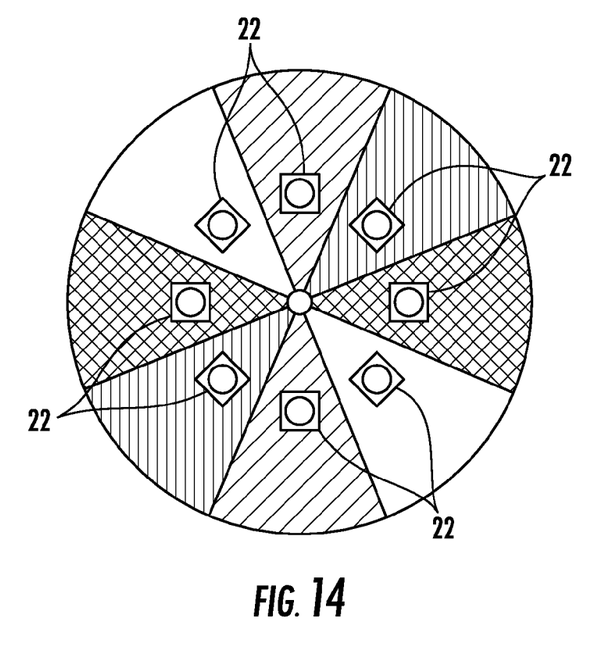

In other embodiments the LED assembly may comprise a plurality of LEDs 22 in an array 30 as shown in FIGS. 3-5, 13 and 14. The LEDs 22 may emit light of different colors that are mixed to create light of a desired color or the LEDs may all emit light of the same color. In one embodiment the area of the exposed components may be color treated with a single colorant that matches the color of the light emitted by the LED array as illustrated in FIG. 3. In other embodiments the area of the exposed components may be color treated with a colorant that does not match the color of the light emitted by the LED array. In some embodiments the area of the exposed components adjacent each LED 22 may be colored a color that matches the color of the light emitted by that LED as illustrated in FIG. 14. In other embodiments the area of the exposed components adjacent each LED 22 may be colored a color that does not match the color of the light emitted by that LED. Referring to FIG. 13, in one embodiment the board may be divided into areas or zones 400, 402 where the areas or zones do not necessarily have a one-to-one relationship with the LEDs 22. The component surfaces of each of the areas or zones 400, 402 may be colored a different color. The color of the areas or zones 400, 402 may match the color of the light emitted from individual LEDs or may match the color of the combined light emitted by the array. In some embodiments, the color of the areas may not match the color of the light emitted from the LEDs or the color of the combined light emitted by the array. While in some embodiments the color treatment of the components matches the color of at least some of the LEDs, the color treatment need not match the LED color in all embodiments and in some embodiments the color may match the color of light emitted by some of the LEDs but may be different than the color of the light emitted by other ones of the LEDs.

The LED or LED array may be arranged relative to a lens or other optic such that light emitted from the LEDs including the light reflected from the color treated component surfaces may be mixed before being emitted from the LED lamp. Mixing of the reflected color with the light emitted from the LEDs may further be used to color tune the emitted light.

In one embodiment a desired light characteristic such as defined by the color rendering index (CRI) may be defined as a desired output of the lamp. An LED or a plurality of LEDs may be provided to emit light of a particular color. The surface areas of the exposed component surfaces may be color treated to tune the color of the emitted light to further define the color characteristics of the light to achieve a desired color output such as defined by the CRI. The CRI is an internationally agreed metric for color rendering evaluation. CRI is calculated based on 14 selected test color samples (TCS 1-14) which were taken from the Munsell color atlas. These color samples are referred to herein as color constituents. While the CRI utilizes fourteen color constituents to evaluate color rendering of a light, different color constituents of light in addition to the fourteen test color samples may be used. The first eight samples (TCS 1-8) are medium saturated colors and the last six samples are four highly saturated colors (red, yellow, green and blue; TCS 9-12) plus complexion (TCS 13) and leaf green (TCS 14). Each color constituent is designated by a TCS or CRI number. For example, the red component may be designated as TCS-9 or CRI-9, the yellow component may be designated TCS 10 or CRI-10 and the like. The CRI of a light is based on the average values for the color rendering indices for each color sample. An explanation of CRI can be found in "Color Rendering and Luminous Efficacy of White LED Spectra" by Yoshi Ohno, National Institute of Standards and Technology; Fourth International Conference on Solid State Lighting; Proc. of SPIE Vol. 5530 (SPIE, Bellingham, Wash., 2004). The CRI of a lamp may be color tuned by using the coloring techniques described herein to enhance the color rendering index of a particular color constituent or color constituents emitted by the lamp. The colors used to color the component surfaces a may be used to color tune the light emitted from the LED by enhancing a constituent color of the emitted light. For example, the addition of a red pigment to the solder mask or the addition of a red color to other exposed surfaces of the lamp may be used to increase the red constituent (TCS-9) of the CRI for the lamp by reflecting the red color and absorbing other colors within the spectra to thereby concentrate some of the red light of the component. In one embodiment, the component may be an XPG LED device manufactured and sold by Cree, Inc. of Durham, N.C., and as described with respect to FIG. 15 that emits a white light. A red pigment may added to the solder mask 72 and/or other red colorant, such as a paint, may be applied to the component surfaces to increase the red component of the CRI. Referring to FIG. 15, for example, the components may be colored red, as represented by the hatching and shading to concentrate the red component (TCS-9 or CR-9) of the red component of the light emitted by the LED. The red color may be added by adding a red colorant to a solder mask or by painting or otherwise coating the exposed surfaces with a red color. While the device is shown with the colorant applied in a selected area of the surface the color may be added to the entire exposed component surface.

Although specific embodiments have been illustrated and described herein, those of ordinary skill in the art appreciate that any arrangement, which is calculated to achieve the same purpose, may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:
1. An LED device comprising:
an LED for emitting light, the light comprising at least one color constituent of a color spectrum, the LED mounted on a component having a component surface;
a non-white colorant of a first color applied to the component surface where the color is in the color spectrum of the at least one color constituent wherein the colorant is not disposed over the LED.

2. The LED device of claim 1 wherein a lens receives the light.

3. The LED device of claim 1 wherein the component surface reflects a portion of the light emitted from the LED chip.

4. The LED device of claim 1 wherein the colorant is in a solder mask applied to the component.

5. The LED device of claim 1 wherein the colorant is applied to the entire component surface.

6. The LED device of claim 1 wherein the colorant is applied to a portion of the exposed component surface.

7. The LED device of claim 1 wherein the color is applied to a first component surface and a second color is applied to a second component surface.

8. An LED device comprising:
a plurality of LED chips each of the LED chips emitting light of a color spectrum, the plurality of LED chips mounted on a component having a component surface;
a non-white colorant applied to the component surface where the colorant is in the color spectrum of at least one of the plurality of LED chips wherein the colorant is not disposed over the plurality of LED chips.

9. The LED device of claim 8 wherein the component surface reflects a portion of the light emitted from the plurality of LED chips.

10. The LED device of claim 8 wherein the colorant is in a solder mask applied to the component.

11. The LED device of claim 8 wherein the colorant is applied to the entire component surface.

12. The LED device of claim 8 wherein the colorant is applied to a first area of the component surface and a second color is applied to a second area of the component surface.

13. The LED device of claim 12 wherein the colorant is in the color spectrum of the light emitted from a first one of the plurality of LED chips and the second color is in the spectrum of the light emitted from a second one of the plurality of LED chips, wherein the color of the light emitted from the first one of the plurality of LED chips is different than the color of the light emitted from the second one of the plurality of LED chips.

14. An LED device comprising:
an LED chip for emitting light of a color spectrum, the LED chip mounted on a component having a component surface;
a non-white colorant applied to the component surface where the colorant is selected to reflect non-white light that is mixed with the light emitted from the LED chip to color tune the light emitted from the LED device to obtain a desired CRI wherein the colorant is not disposed over the LED chip.

15. The LED device of claim 14 wherein a lens receives the emitted light.

16. The LED device of claim 14 wherein the colorant is in a solder mask.

17. The LED device of claim 14 wherein the colorant is applied to the entire exposed component surface.

18. The LED device of claim 14 wherein the colorant is applied to a first area of the component surface and a second color is applied to a second area of the component surface.

19. The LED device of claim 14 wherein the colorant matches the light emitted from the LED device.

20. An LED device comprising:
- an LED chip for emitting light of a color spectrum, the LED chip mounted on a component having a component surface;
- a non-white colorant applied to the component surface where the colorant is in a second color spectrum that is different than the color spectrum wherein the colorant is not disposed over the LED chip.

21. The LED device of claim 20 wherein the component surface reflects a portion of the light emitted from the LED chip.

22. The LED device of claim 20 wherein the colorant is in a solder mask applied to the component.

23. The LED device of claim 20 wherein the light has a plurality of color components and the colorant is in the color spectrum of at least one of the color components.

24. The LED device of claim 20 wherein the color spectrum is white and the second color spectrum is the red spectrum.

25. An LED device comprising:
- an LED chip for emitting light of a color spectrum, the LED chip mounted on a component having a component surface;
- a non-white colorant applied to the exposed surface where the colorant is selected to reflect light to color tune the light emitted from the LED device to obtain a desired CRI wherein the colorant is not disposed over the LED chip wherein the colorant matches the light emitted from the LED device.

* * * * *